US011714139B2

(12) United States Patent
Chen et al.

(10) Patent No.: US 11,714,139 B2
(45) Date of Patent: Aug. 1, 2023

(54) ELECTRONIC LOAD APPARATUS

(71) Applicant: CHROMA ATE INC., Taoyuan (TW)

(72) Inventors: Wen-Chung Chen, Taoyuan (TW);
Ming-Ing Tsou, Taoyuan (TW);
Chien-Hsing Huang, Taoyuan (TW);
Chun-Sheng Hung, Taoyuan (TW);
Kuan-Hung Lee, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 129 days.

(21) Appl. No.: 17/371,976

(22) Filed: Jul. 9, 2021

(65) Prior Publication Data

US 2022/0206080 A1 Jun. 30, 2022

(30) Foreign Application Priority Data

Dec. 28, 2020 (TW) .................................. 109146445

(51) Int. Cl.
*G01R 31/40* (2020.01)
*G01R 19/10* (2006.01)
*G01R 1/20* (2006.01)

(52) U.S. Cl.
CPC .............. *G01R 31/40* (2013.01); *G01R 1/203* (2013.01); *G01R 19/10* (2013.01)

(58) Field of Classification Search
CPC ......... G01R 31/40; G01R 1/203; G01R 19/10
(Continued)

(56) References Cited

U.S. PATENT DOCUMENTS 3,836,907 A * 9/1974 Nercessian ............. H03M 1/74
341/137
4,320,354 A * 3/1982 Harrison ............ H03H 11/1213
330/306
(Continued)

FOREIGN PATENT DOCUMENTS

CN 104699158 B 5/2017
CN 207946506 U 10/2018
(Continued)

OTHER PUBLICATIONS

Search Report in Taiwan Counterpart Application No. 109146445, dated May 24, 2021, in 5 pages; English translation provided.

*Primary Examiner* — Giovanni Astacio-Oquendo
(74) *Attorney, Agent, or Firm* — Duane Morris LLP

(57) ABSTRACT

The present disclosure relates to an electronic load apparatus. An embodiment of the present disclosure includes an electronic load apparatus including: a measurement resistor, a reference circuit, a transistor, and a feedback circuit. The measurement resistor includes a first contact, a second contact, a third contact, and a fourth contact. The first contact and the second contact are located at a first end of the measurement resistor. The third contact and the fourth contact are located at a second end of the measurement resistor. A reference power (or a reference voltage) electrically connects to the reference circuit. The reference circuit and the first contact of the measurement resistor are electrically connected. The transistor includes a drain, a gate, and a source. The reference circuit and the gate of the transistor are electrically connected. One of the source and the drain of the transistor electrically connects to the second contact of the measurement resistor. The other one of the drain and the source of the transistor electrically connects to an output terminal of a unit under test. The feedback circuit and the fourth contact of the measurement resistor are (Continued)

electrically connected. The feedback circuit and the reference circuit are electrically connected.

12 Claims, 10 Drawing Sheets

(58) Field of Classification Search
USPC .................................... 324/764.01, 537, 500
See application file for complete search history.

(56) References Cited

U.S. PATENT DOCUMENTS

| | | | | |
|---|---|---|---|---|
| 4,641,045 | A * | 2/1987 | Darrow | H03K 19/21 |
| | | | | 327/63 |
| 5,903,422 | A | 5/1999 | Hosokawa | |
| 6,545,513 | B2 | 4/2003 | Tsuchida | |
| 9,429,629 | B1 * | 8/2016 | Pitel | G01R 31/40 |
| 10,859,601 | B2 * | 12/2020 | Narikawa | G01R 31/2879 |
| 2013/0096864 | A1 | 4/2013 | Bai | |
| 2023/0003771 | A1 * | 1/2023 | Huang | G01R 19/0092 |

FOREIGN PATENT DOCUMENTS

| | | |
|---|---|---|
| CN | 208188173 U | 12/2018 |
| JP | H0599968 A | 4/1993 |
| TW | 201316149 A | 4/2013 |

\* cited by examiner

ELECTRONIC LOAD APPARATUS

BACKGROUND OF THE INVENTION

1. Field of the Invention

The present disclosure relates to an electronic load apparatus, and more particularly to an electronic load apparatus including a resistor with four contacts.

2. Description of the Related Art

The resistance value of a material used in a circuit will change along with the temperature change. The relationship between the temperature and the resistance value can be expressed as the temperature coefficient of resistance (TCR). If the resistance value of the material increases along with the temperature rise, the temperature coefficient of resistance is positive; if the resistance value of the material decreases along with the temperature rise, the temperature coefficient of resistance is negative. In an electronic apparatus, not only the resistance value of the resistor but also the resistance value of a solder may change along with the temperature change. When the resistance value of the resistor is similar to the resistance value of the solder, the change of the resistance value of the solder may cause errors in the electronic apparatus.

It is common in the industry to perform a pre-factory test on a power supply apparatus by using an electronic load apparatus. The electronic load apparatus can simulate an power consumption behavior of an electronic apparatus, thereby checking whether the power supply apparatus can normally supply power to the electronic apparatus or not. Therefore, an electronic load device is an indispensable test apparatus for the development and manufacture of a power device. The electronic load device can consume electric energy by dissipating power of an internal load element, and can further simulate power consumption behaviors in different operation modes, such as power consumption behaviors in full-speed operation or power consumption behaviors in a standby state, by controlling the internal load element. Alternatively, the electronic load device may subject to an environmental test together with a power supply apparatus under test, so as to check operation conditions of the power supply apparatus under test in different environments, for example, whether the supply voltage or current is within a rated range or not, stable or not, and the like. However, when the resistance value of the load element used by the electronic load device will change along with the temperature change during the environment temperature test, the changed resistance value may cause an error in the measured voltage value or current value, so that the output voltage or current of the power supply apparatus under test cannot be accurately determined.

SUMMARY OF THE INVENTION

The present disclosure provides a novel electronic load apparatus. The electronic load apparatus of the present disclosure can effectively reduce errors caused by the resistance value of a solder.

Some embodiments of the present disclosure provide an electronic load apparatus. The electronic load apparatus includes a measurement resistor, a reference circuit, a transistor, and a feedback circuit. The measurement resistor includes a first contact, a second contact, a third contact, and a fourth contact. The first contact and the second contact are located at a first end of the measurement resistor. The third contact and the fourth contact are located at a second end of the measurement resistor. A reference power electrically connects to the reference circuit. The reference circuit and the first contact of the measurement resistor are electrically connected. The transistor includes a drain, a gate, and a source. The reference circuit and the gate of the transistor are electrically connected. One of the source and the drain of the transistor electrically connects to the second contact of the measurement resistor. The other one of the drain and the source of the transistor electrically connects to an output terminal of a unit under test. The feedback circuit and the fourth contact of the measurement resistor are electrically connected. The feedback circuit and the reference circuit are electrically connected.

Other embodiments of the present disclosure provide an electronic load apparatus. A load current value passing through a second contact of a measurement resistor is determined based on a voltage value across the measurement resistor and a resistance value of the measurement resistor.

More embodiments of the present disclosure provide an electronic load apparatus. A first current value passing through a first contact of a measurement resistor is smaller than a load current value passing through a second contact of the measurement resistor.

BRIEF DESCRIPTION OF THE DRAWINGS

Through the following detailed description with reference to the drawings, features of the present disclosure will become easier to understand. It should be noted that various features may not be drawn to scale. Indeed, the size of various features may be arbitrarily increased or decreased for the purpose of clarity of description.

DETAILED DESCRIPTIONS OF THE PRESENT DISCLOSURE

Figure 1:
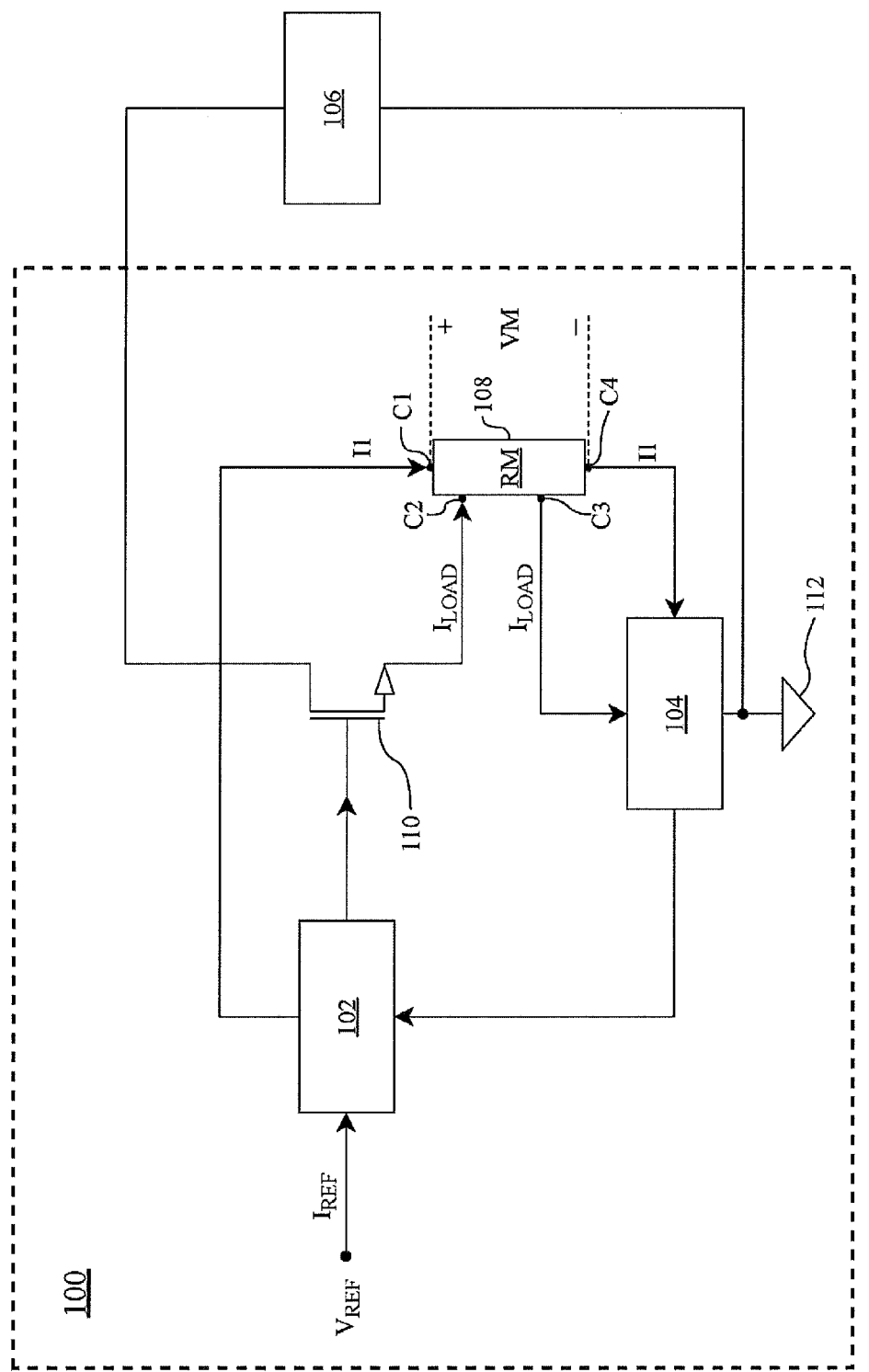
FIG. 1 is a schematic circuit diagram of an electronic load apparatus according to an embodiment of the present disclosure.

The disclosure below provides various different embodiments or examples for implementing different features of the provided subject matter. Specific examples and configurations of components are described below. Of course, these descriptions are merely examples and are not intended to limit the present disclosure. According to the present disclosure, in the following descriptions, the description of electrical connection or electrical coupling of a first element to a second element may include an embodiment formed by indirect electrical connection or electrical coupling between the first element and the second element, and may further include an embodiment in which one or a plurality of additionally element features are formed between the first element and the second element so that the first element and the second element are not in direct electrical connection or electrical coupling. Additionally, according to the present disclosure, reference numerals and/or letters may be repeated in the examples. This repetition is for the purposes of simplicity and clarity and does not indicate a relationship among various described embodiments and/or configurations.

Embodiments of the present disclosure are described in detail below. However, it should be understood that many applicable concepts provided by the present disclosure may be implemented in a plurality of specific environments. The described specific embodiments are illustrative only and are not intended to limit the scope of the present disclosure.

FIG. 1 is a schematic circuit diagram of an electronic load apparatus 100 according to an embodiment of the present disclosure. In some embodiments, the electronic load apparatus 100 may include a reference circuit 102, a feedback circuit 104, a transistor 110, a reference power $I_{REF}$, a measurement resistor 108 and a grounding point 112. Directions of arrows shown in FIG. 1 may be used for indicating directions of current I1 or load current $I_{LOAD}$.

The electronic load apparatus 100 may electrically connect to a unit under test 106. In some embodiments, the current of the unit under test 106 can be output from an output terminal of the unit under test 106, passes through the electronic load apparatus 100, and is then input into the unit under test 106 from an input terminal of the unit under test 106. The current output from the output terminal of the unit under test 106 may pass through one or more of the reference circuit 102, the feedback circuit 104, the transistor 110 and the measurement resistor 108.

The measurement resistor 108 may have a resistance value RM. The measurement resistor 108 may have a contact C1, a contact C2, a contact C3 and a contact C4. The contact C1 and the contact C2 of the measurement resistor 108 may be located at one end of the measurement resistor 108. The contact C3 and the contact C4 of the measurement resistor 108 may be located at the other end of the measurement resistor 108. The contact C1 of the measurement resistor 108 may electrically connect to the reference circuit 102. The contact C2 of the measurement resistor 108 may electrically connect to the transistor 110. For example, the contact C2 of the measurement resistor 108 may electrically connect to a drain or a source of the transistor 110. The contact C3 of the measurement resistor 108 may electrically connect to the feedback circuit 104. The contact C4 of the measurement resistor 108 may electrically connect to the feedback circuit 104.

The contacts C1, C2, C3 and C4 of the measurement resistor 108 may electrically connect to different elements through a soldering material. According to the embodiment of FIG. 1, the contact C1 of the measurement resistor 108 may electrically connect to the reference circuit 102 through a first solder ball. The contact C2 of the measurement resistor 108 may electrically connect to the transistor 110 through a second solder ball. The contact C3 of the measurement resistor 108 may electrically connect to the feedback circuit 104 through a third solder ball. The contact C4 of the measurement resistor 108 may electrically connect to the feedback circuit 104 through a fourth solder ball.

In some embodiments, the measurement resistor 108 may be a coil made of a single metal or a single alloy. The contact C1 and the contact C2 may be formed by cutting one end of the coil. The contact C3 and the contact C4 may be formed by cutting the other end of the coil. The contact C1 and the contact C2 of the measurement resistor 108 may be made of the same material, and do not include other soldering materials. Therefore, the contact C1 and the contact C2 of the measurement resistor 108 may be homogeneous. The contact C3 and the contact C4 of the measurement resistor 108 may be made of the same material, and do not include other soldering materials. Therefore, the contact C3 and the contact C4 of the measurement resistor 108 may be homogeneous.

The current I1 may flow into the measurement resistor 108 from the contact C1. The load current $I_{LOAD}$ may flow into the measurement resistor 108 from the contact C2. The current I1 may flow out of the measurement resistor 108 from the contact C4. The load current $I_{LOAD}$ may flow out of the measurement resistor 108 from the contact C3. The current I1 may be smaller than the load current $I_{LOAD}$. In some embodiments, the current I1 may be much smaller than the load current $I_{LOAD}$.

The reference circuit 102 may electrically connect to the transistor 110. For example, the reference circuit 102 may electrically connect to a gate of the transistor 110. The reference circuit 102 may electrically connect to the feedback circuit 104. The reference circuit 102 may control the voltage or the current I1 applied to the gate of the transistor 110 on the basis of the feedback circuit 104. The reference circuit 102 may electrically connect to the contact C1 of the measurement resistor 108. The reference circuit 102 may electrically connect to a reference power $V_{REF}$. In some embodiments, the reference power $V_{REF}$ may generate a corresponding reference current $I_{REF}$. For example, the reference power $V_{REF}$ is set to output a voltage value, and will correspondingly generate the reference current $I_{REF}$. The reference current $I_{REF}$ may be several milliamperes.

In some embodiments, the reference power $V_{REF}$ may control the load current $I_{LOAD}$ by regulating the voltage provided by the reference power $V_{REF}$. For example, the reference power $V_{REF}$ is set to output a voltage value, and the voltage output by the reference power $V_{REF}$ may pass through a secondary amplifier to control a gate voltage of the transistor 110, thus controlling the load current $I_{LOAD}$.

The gate of the transistor 110 may electrically connect to the reference circuit 102. The drain or the source of the transistor 110 may electrically connect to the contact C2 of the measurement resistor 108. The source or the drain of the transistor 110 may electrically connect to the output terminal of the unit under test 106. In the embodiment of FIG. 1, the source of the transistor 110 may electrically connect to the contact C2 of the measurement resistor 108. The drain of the transistor 110 may electrically connect to the output terminal of the unit under test 106. In some embodiments, the drain of the transistor 110 may electrically connect to the contact C2 of the measurement resistor 108. The source of the transistor 110 may electrically connect to the output terminal of the unit under test 106. The output terminal of the unit under test 106 may be a terminal from which the current is output from the unit under test.

The feedback circuit 104 may electrically connect to the reference circuit 102. The feedback circuit 104 may electrically connect to the contact C3 of the measurement resistor 108. The feedback circuit 104 may electrically connect to the contact C4 of the measurement resistor 108. The feedback circuit 104 may electrically connect to a grounding point 112. The feedback circuit 104 may electrically connect to the unit under test 106. For example, the feedback circuit 104 may electrically connect to the input terminal of the unit under test 106. The input terminal of the unit under test 106 may be a terminal from which the current is input into the unit under test.

The electronic load apparatus 100 in FIG. 1 may electrically connect to the unit under test 106 to measure a plurality of physical features of the unit under test 106, such as electrical features. In some embodiments, the load current $I_{LOAD}$ passing through the measurement resistor 108 may be determined on the basis of a voltage difference VM across the measurement resistor 108 and the resistance value RM of the measurement resistor 108. According to the Ohm's law, the relationship among the voltage difference VM, the resistance value RM, the current I1 and the load current $I_{LOAD}$ is as shown in Equation (1):

$$(I1 + I_{LOAD}) = \frac{VM}{RM}. \quad (1)$$

When the current I1 is much smaller than the load current $I_{LOAD}$, according to the Ohm's law, the relationship among the voltage difference VM, the resistance value RM, the current I1 and the load current $I_{LOAD}$ is as shown in Equation (2):

$$I_{LOAD} = \frac{VM}{RM}. \quad (2)$$

Figure 2:
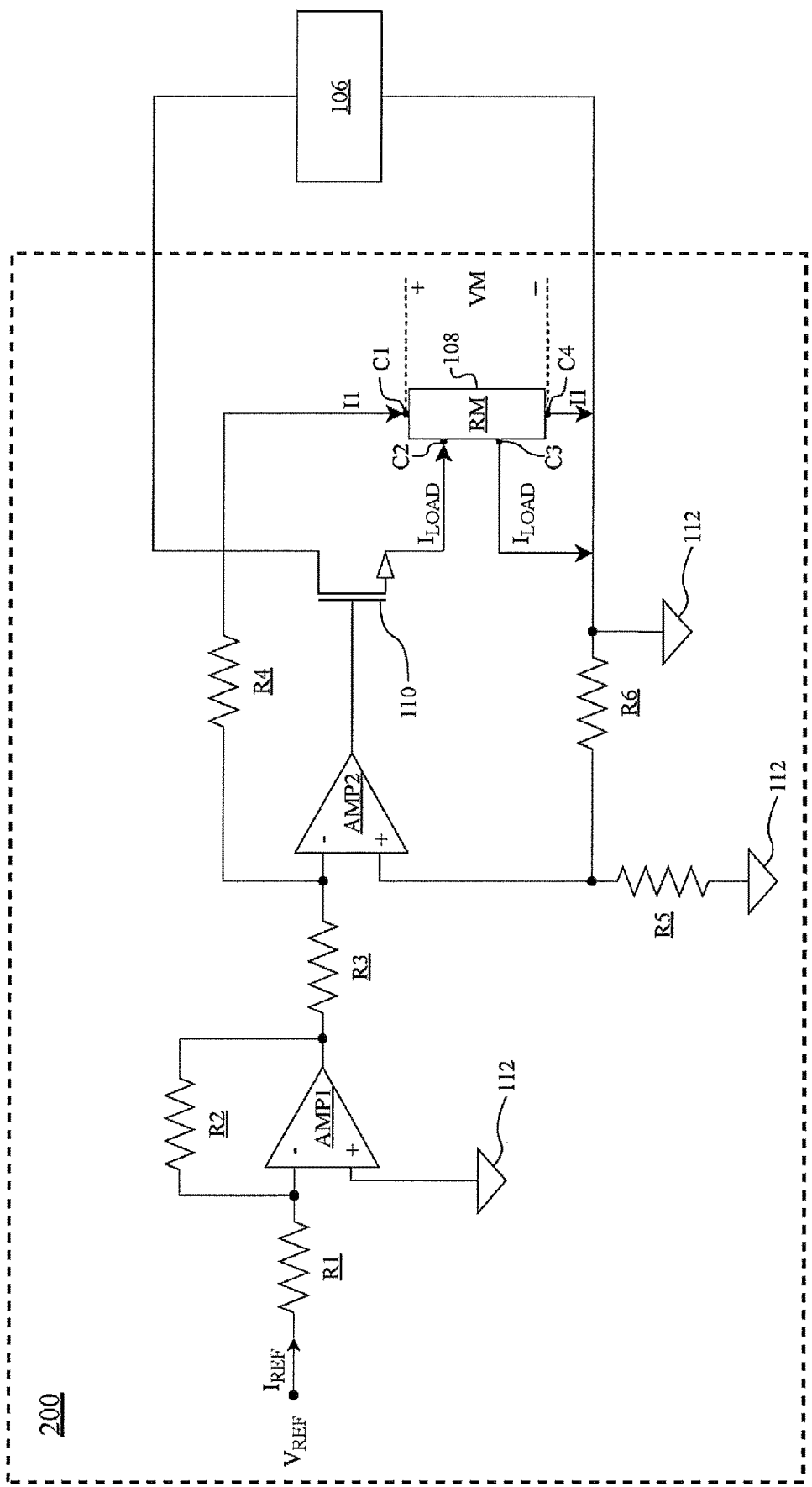
FIG. 2 is a schematic circuit diagram of an electronic load apparatus according to an embodiment of the present disclosure.

FIG. 2 is a schematic circuit diagram of an electronic load apparatus 200 according to an embodiment of the present disclosure. The electronic load apparatus 200 may be an embodiment of the electronic load apparatus 100. For more simply describing the present disclosure, elements using the same element symbols in FIG. 1 and FIG. 2 may represent the same or similar elements, or may represent elements with the same or similar functions. Additionally, values using the same element symbols in FIG. 1 and FIG. 2 may represent the same or similar values, or may represent values with the same or similar physical meanings.

The electronic load apparatus 200 shown in FIG. 2 may include a resistor R1, a resistor R2, a resistor R3, a resistor R4, an operational amplifier AMP1 and an operational amplifier AMP2. According to the embodiment of FIG. 2, the resistor R1, the resistor R2, the operational amplifier AMP1 and a reference power $V_{REF}$ may form an inverting closed-loop amplifier. The resistor R1 may electrically connect to an input terminal (for example, an inverted input terminal) of the operational amplifier AMP1. The resistor R2 may electrically connect to the input terminal (for example, the inverted input terminal) and an output terminal of the operational amplifier AMP1. The reference power $V_{REF}$ may further electrically connect to the resistor R1. A grounding point 112 may further electrically connect to the other input terminal (for example, a non-inverted input terminal) of the operational amplifier AMP1.

According to the embodiment of FIG. 2, the resistor R3, the resistor R4 and the operational amplifier AMP2 may form an inverting closed-loop amplifier. The resistor R3 may electrically connect to an input terminal (for example, an inverted input terminal) of the operational amplifier AMP2. The resistor R4 may electrically connect to the input terminal (for example, the inverted input terminal) of the operational amplifier AMP2. The output terminal of the operational amplifier AMP1 may further electrically connect to the resistor R3. A measurement resistor 108 may further electrically connect to the resistor R4 (for example, through a contact C1). A transistor 110 may further electrically connect to an output terminal of the operational amplifier AMP2. For example, a gate of the transistor 110 may further electrically connect to the output terminal of the operational amplifier AMP2. A resistor R5 and a resistor R6 may further electrically connect to the other input terminal (for example, a non-inverted input terminal) of the operational amplifier AMP2.

The inverting closed-loop amplifier including the operational amplifier AMP1 and the inverting closed-loop amplifier including the operational amplifier AMP2 are configured in cascade connection. In some embodiments, a combination of the two inverting closed-loop amplifiers can be served as the reference circuit 102 as shown in FIG. 1. Referring to FIG. 2, the reference power $V_{REF}$ may electrically connect to the contact C1 of the measurement resistor 108 through the two inverting closed-loop amplifiers. In some embodiments, the reference power $V_{REF}$ may electrically connect to the contact C1 of the measurement resistor 108 through the reference circuit 102. The reference power $V_{REF}$ may electrically connect to the transistor 110 (for example, the gate) through the reference circuit 102.

In some embodiments, the resistor R4 may be configured to feed the voltage of the contact C1 to the operational amplifier AMP2. For example, the voltage of the contact C1 may be fed back through the resistor R4 to be input into the operational amplifier AMP2. The reference power $V_{REF}$ may be input into the operational amplifier AMP2 through the resistor R1, the resistor R2 and the resistor R3. In the present embodiment, the operational amplifier AMP2 may be served as an addition module or a subtraction module.

In other embodiments, if the reference power $V_{REF}$ does not change, the voltage of the corresponding input terminal (for example, the inverted input terminal) of the operational amplifier AMP2 may be a constant value. When the reference power $V_{REF}$ does not change, and the voltage of the contact C1 increases, the voltage of the contact C1 may be input into the operational amplifier AMP2 through the resistor R4. The operational amplifier AMP2 may be served as the subtraction module to reduce the output of the operational amplifier AMP2. Therefore, the gate voltage of the transistor 110 may drop, the corresponding current may decrease, and the voltage of the contact C1 may decrease, so as to achieve the balance.

In other embodiments, if the reference power $V_{REF}$ does not change, the voltage of the corresponding input terminal (for example, the inverted input terminal) of the operational amplifier AMP2 may be a constant value. When the reference power $V_{REF}$ does not change, and the voltage of the contact C1 decreases, the voltage of the contact C1 may be input into the operational amplifier AMP2 through the resistor R4. The operational amplifier AMP2 may be served as the subtraction module to improve the output of the operational amplifier AMP2. Therefore, the gate voltage of the transistor 110 may increase, the corresponding current may increase, and the voltage of the contact C1 may increase, so as to achieve the balance.

The electronic load apparatus 200 shown in FIG. 2 may include a resistor R5 and a resistor R6. According to the embodiment of FIG. 2, the resistor R5 and the resistor R6 electrically connect to the input terminal (for example, the non-inverted input terminal) of the operational amplifier AMP2. The resistor R5 may electrically connect to the grounding point 112. The resistor R6 may electrically connect to the measurement resistor 108 (for example, through a contact C3 and a contact C4). The resistor R6 may electrically connect to one terminal (for example, the current input terminal) of the unit under test 106. The resistor R6 may electrically connect to the grounding point 112. In some embodiments, a combination of the resistor R5 and the resistor R6 may be served as the feedback circuit 104 shown in FIG. 1.

Figure 3:
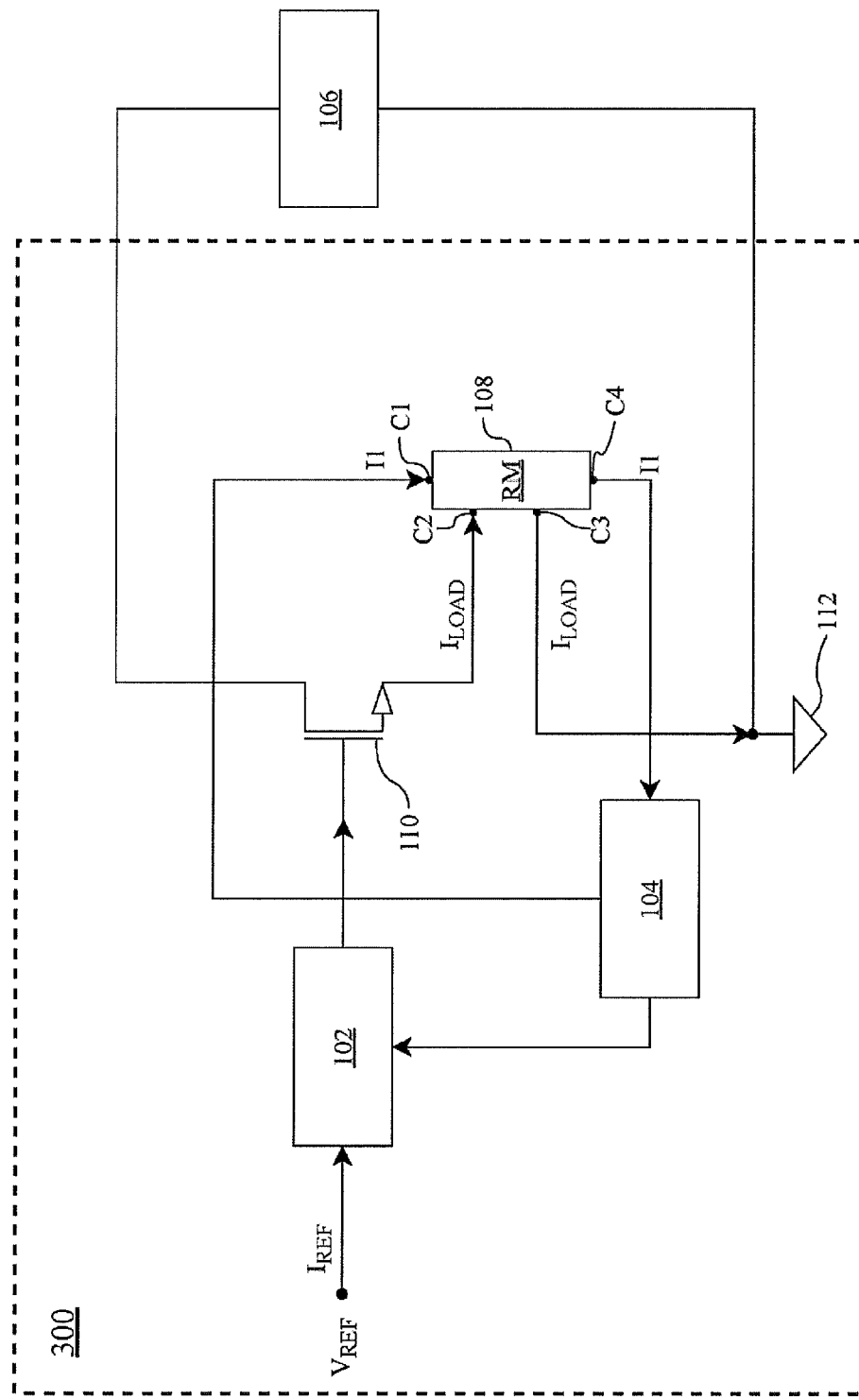
FIG. 3 is a schematic circuit diagram of an electronic load apparatus according to an embodiment of the present disclosure.

FIG. 3 is a schematic circuit diagram of an electronic load apparatus 300 according to an embodiment of the present disclosure. For more simply describing the present disclosure, elements using the same element symbols in FIG. 1 and FIG. 3 may represent the same or similar elements, or may represent elements with the same or similar functions. Additionally, values using the same element symbols in FIG. 1 and FIG. 3 may represent the same or similar values, or may represent values with the same or similar physical meanings.

Referring to FIG. 3, a reference circuit 102 may electrically connect to a reference power $V_{REF}$. The reference circuit 102 may electrically connect to a transistor 110 (for example, a gate of the transistor 110). The reference circuit 102 may electrically connect to a feedback circuit 104. The reference circuit 102 shown in FIG. 1 and the measurement resistor 108 may be in direct electrical connection (for example, through the contact C1). The reference circuit 102 shown in FIG. 3 may electrically connect to a measurement resistor 108 through the feedback circuit 104 (for example, through a contact C1).

Referring to FIG. 3, the feedback circuit 104 may electrically connect to the reference circuit 102. The feedback circuit 104 may electrically connect to the measurement resistor 108 (for example, through the contact C1 and a contact C4). The feedback circuit 104 shown in FIG. 1 may electrically connect to the measurement resistor 108 through the contact C3 and the contact C4. The feedback circuit 104 shown in FIG. 3 may electrically connect to the measurement resistor 108 through the contact C1 and the contact C4.

Referring to FIG. 3, the measurement resistor 108 may have a resistance value RM. The measurement resistor 108 may be provided with the contact C1, a contact C2, the contact C3 and the contact C4. The contact C1 and the contact C2 of the measurement resistor 108 may be located at one end of the measurement resistor 108. The contact C3 and the contact C4 of the measurement resistor 108 may be located at the other end of the measurement resistor 108. The contact C1 of the measurement resistor 108 may electrically connect to the feedback circuit 104. The contact C2 of the measurement resistor 108 may electrically connect to the transistor 110. For example, the contact C2 of the measurement resistor 108 may electrically connect to a drain or a source of the transistor 110. The contact C3 of the measurement resistor 108 may electrically connect to a grounding point 112. The contact C4 of the measurement resistor 108 may electrically connect to the feedback circuit 104.

The contacts C1, C2, C3 and C4 of the measurement resistor 108 may electrically connect to different elements through a soldering material. According to the embodiment of FIG. 3, the contact C1 of the measurement resistor 108 may electrically connect to the feedback circuit 104 through a first solder ball. The contact C2 of the measurement resistor 108 may electrically connect to the transistor 110 through a second solder ball. The contact C3 of the measurement resistor 108 may electrically connect to the grounding point 112 through a third solder ball. The contact C4 of the measurement resistor 108 may electrically connect to the feedback circuit 104 through a fourth solder ball.

A current I1 may flow into the measurement resistor 108 from the contact C1. A load current $I_{LOAD}$ may flow into the measurement resistor 108 from the contact C2. The current I1 may flow out of the measurement resistor 108 from the contact C3. The load current $I_{LOAD}$ may flow out of the measurement resistor 108 from the contact C2. The current I1 may be smaller than the load current $I_{LOAD}$. In some embodiments, the current I1 may be much smaller than the load current $I_{LOAD}$.

The gate of the transistor 110 may electrically connect to the reference circuit 102. The drain or the source of the transistor 110 may electrically connect to the contact C2 of the measurement resistor 108. The source or the drain of the transistor 110 may electrically connect to the output terminal of a unit under test 106. In the embodiment of FIG. 1, the source of the transistor 110 may electrically connect to the contact C2 of the measurement resistor 108. The drain of the transistor 110 may electrically connect to the output terminal of the unit under test 106. In some embodiments, the drain of the transistor 110 may electrically connect to the contact C2 of the measurement resistor 108. The source of the transistor 110 may electrically connect to the output terminal of the unit under test 106. The output terminal of the unit under test 106 may be a terminal from which the current is output from the unit under test.

The electronic load apparatus 300 in FIG. 3 may electrically connect to the unit under test 106 to measure a plurality of physical features of the unit under test 106, such as electrical features. The output terminal of the unit under test 106 may electrically connect to the drain or the source of the transistor 110. The input terminal of the unit under test 106 may electrically connect to the grounding point 112 and the measurement resistor 108 (for example, through the contact C3). The input terminal of the unit under test 106 may be a terminal from which the current is input into the unit under test. In some embodiments, the load current $I_{LOAD}$ passing through the measurement resistor 108 may be determined on the basis of a voltage difference VM across the measurement resistor 108 and a resistance value RM of the measurement resistor 108.

Figure 4:
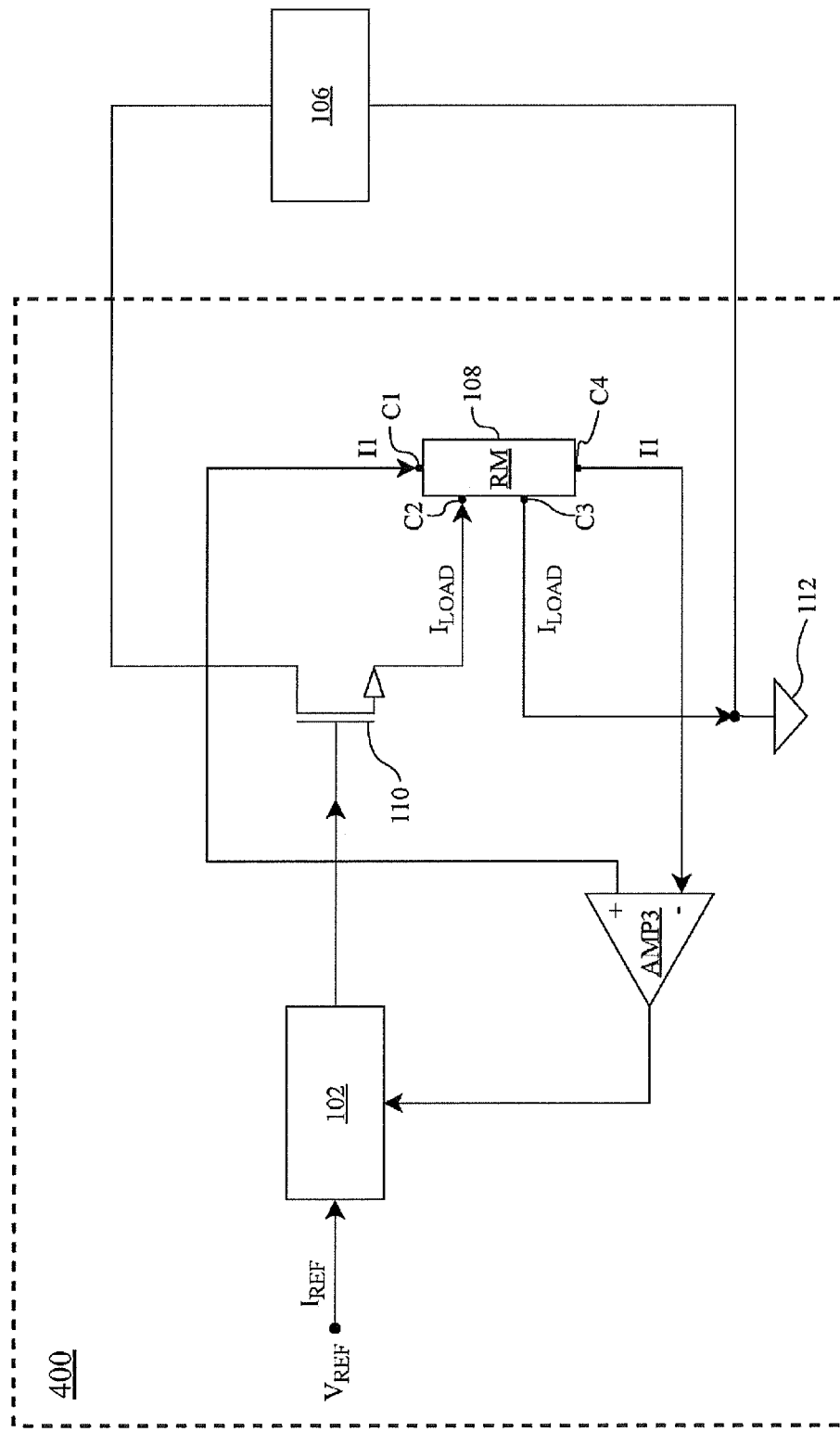
FIG. 4 is a schematic circuit diagram of an electronic load apparatus according to an embodiment of the present disclosure.

FIG. 4 is a schematic circuit diagram of an electronic load apparatus 400 according to an embodiment of the present disclosure. The electronic load apparatus 400 may be an embodiment of the electronic load apparatus 300. For more simply describing the present disclosure, elements using the same element symbols in FIG. 3 and FIG. 4 may represent the same or similar elements, or may represent elements with the same or similar functions. Additionally, values using the same element symbols in FIG. 3 and FIG. 4 may represent the same or similar values, or may represent values with the same or similar physical meanings.

The electronic load apparatus 400 shown in FIG. 4 may include an operational amplifier AMP3. A measurement resistor 108 (for example, through a contact C4) may electrically connect to an input terminal (for example, an inverted input terminal) of the operational amplifier AMP3. The measurement resistor 108 (for example, through a contact C1) may electrically connect to the other input terminal (for example, a non-inverted input terminal) of the operational amplifier AMP3. An output terminal of the operational amplifier AMP3 may electrically connect to a reference circuit 102. The reference circuit 102 may generate a voltage or current applied to a transistor 110 (for example, a gate of the transistor 110) on the basis of an output voltage or current of the operational amplifier AMP3 and a reference power $V_{REF}$ (or a reference current $I_{REF}$). The voltage or current applied to the transistor 110 (for example, the gate of the transistor 110) may be determined on the basis of the voltage or the current of the contact C1 and a contact C4. In some embodiments, the operational amplifier AMP3 may be served as the feedback circuit 104 shown in FIG. 3.

Figure 5:
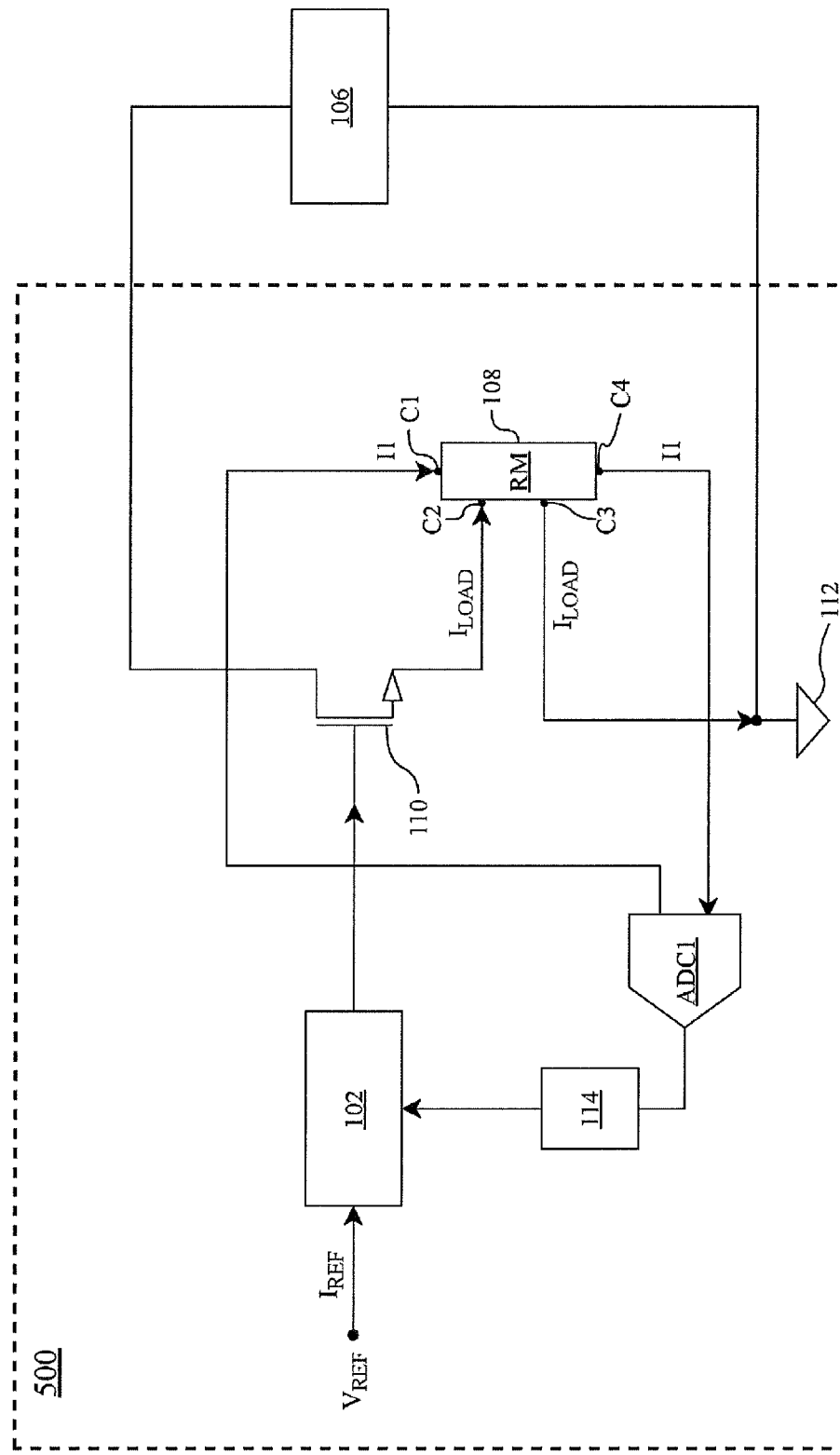
FIG. 5 is a schematic circuit diagram of an electronic load apparatus according to an embodiment of the present disclosure.

FIG. 5 is a schematic circuit diagram of an electronic load apparatus 500 according to an embodiment of the present disclosure. The electronic load apparatus 500 may be an embodiment of the electronic load apparatus 300. For more simply describing the present disclosure, elements using the same element symbols in FIG. 3 and FIG. 5 may represent the same or similar elements, or may represent elements with the same or similar functions. Additionally, values using the same element symbols in FIG. 3 and FIG. 5 may represent the same or similar values, or may represent values with the same or similar physical meanings.

The electronic load apparatus 500 as shown in FIG. 5 may include an analog-to-digital converter ADC1 and a digital control circuit 114. A measurement resistor 108 (for example, through a contact C4) may electrically connect to an input terminal of the analog-to-digital converter ADC1. The measurement resistor 108 (for example, through a contact C1) may electrically connect to the other input terminal of the analog-to-digital converter ADC1. An output terminal of the analog-to-digital converter ADC1 may electrically connect to the digital control circuit 114. The digital control circuit 114 may generate an output voltage or current on the basis of an output voltage or current of the analog-to-digital converter ADC1. An output terminal of the digital control circuit 114 may electrically connect to a reference circuit 102. The reference circuit 102 may generate a voltage or current applied to a transistor 110 (for example, a gate of the transistor 110) on the basis of the output voltage or current of the digital control circuit 114 and a reference power $V_{REF}$ (or a reference current $I_{REF}$). The voltage or current applied to the transistor 110 (for example, the gate of the transistor 110) may be determined on the basis of the voltage or the current of the contact C1 and the contact C4. In some embodiments, a combination of the analog-to-digital converter ADC1 and the digital control circuit 114 may be served as the feedback circuit 104 shown in FIG. 3.

Figure 6:
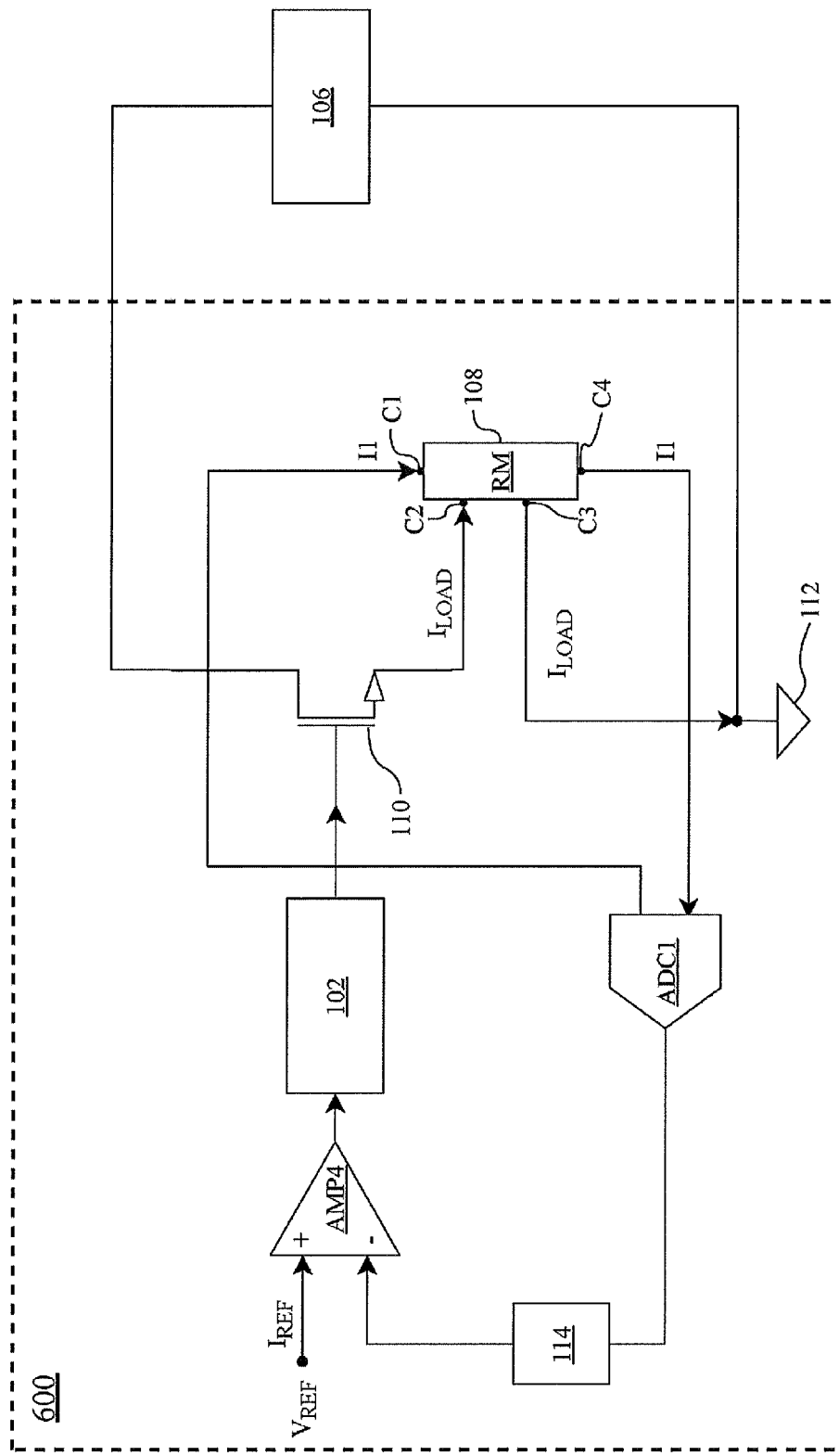
FIG. 6 is a schematic circuit diagram of an electronic load apparatus according to an embodiment of the present disclosure.

FIG. 6 is a schematic circuit diagram of an electronic load apparatus 600 according to an embodiment of the present disclosure. The electronic load apparatus 600 may be an embodiment of the electronic load apparatus 300. For more simply describing the present disclosure, elements using the same element symbols in FIG. 3 and FIG. 6 may represent the same or similar elements, or may represent elements with the same or similar functions. Additionally, values using the same element symbols in FIG. 3 and FIG. 6 may represent the same or similar values, or may represent values with the same or similar physical meanings.

The electronic load apparatus 600 shown in FIG. 6 may include an analog-to-digital converter ADC1, a digital control circuit 114 and an operational amplifier AMP4. A measurement resistor 108 (for example, through a contact C4) may electrically connect to an input terminal of the analog-to-digital converter ADC1. The measurement resistor 108 (for example, through a contact C1) may electrically connect to the other input terminal of the analog-to-digital converter ADC1. An output terminal of the analog-to-digital converter ADC1 may electrically connect to the digital control circuit 114. The digital control circuit 114 may generate an output voltage on the basis of an output voltage of the analog-to-digital converter ADC1.

An output terminal of the digital control circuit 114 may electrically connect to a reference circuit 102. According to the embodiment of FIG. 6, the output terminal of the digital control circuit 114 may electrically connect to the reference circuit 102 through the operational amplifier AMP4. The output terminal of the digital control circuit 114 may electrically connect to an input terminal (for example, an inverted input terminal) of the operational amplifier AMP4. A reference power $V_{REF}$ may electrically connect to the other input terminal (for example, a non-inverted input terminal) of the operational amplifier AMP4. The output terminal of operational amplifier AMP4 may electrically connect to the reference circuit 102.

The reference circuit 102 may generate a voltage or current applied to a transistor 110 (for example, a gate of the transistor 110) on the basis of the output voltage or current of the operational amplifier AMP4. The reference circuit 102 may also generate a voltage applied to the transistor 110 (for example, the gate of the transistor 110) on the basis of the output voltage of the digital control circuit 114 and the reference power $V_{REF}$. The voltage or current applied to the transistor 110 (for example, the gate of the transistor 110) may be determined on the basis of the voltage or the current of the contact C1 and the contact C4. In some embodiments, a combination of the analog-to-digital converter ADC1, the digital control circuit 114 and the operational amplifier AMP4 may be served as the feedback circuit 104 shown in FIG. 3. Through the operational amplifier AMP4, the voltage or current input into the reference circuit 102 may be more precisely controlled. In some embodiments, the operational amplifier AMP4 may also be a subtraction circuit.

Figure 7B:
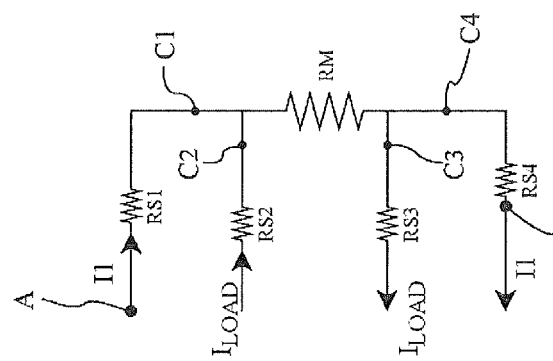
FIG. 7A and FIG. 7B are schematic circuit diagrams of a measurement resistor according to an embodiment of the present disclosure.
Figure 7A:
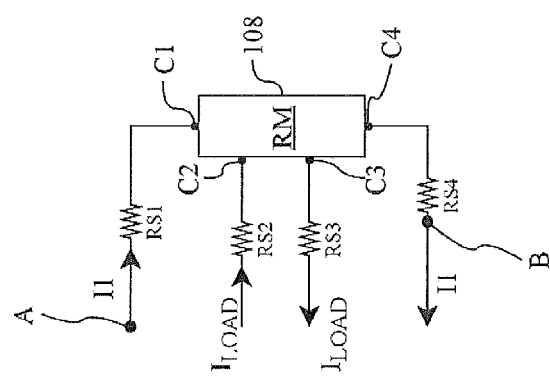

FIG. 7A and FIG. 7B are schematic circuit diagrams of a measurement resistor 108 according to an embodiment of the present disclosure. FIG. 7B may be an equivalent circuit diagram of FIG. 7A. For more simply describing the present disclosure, elements using the same element symbols in FIG. 1, FIG. 2, FIG. 7A and FIG. 7B may represent the same or similar elements, or may represent elements with the same or similar functions. Additionally, values using the same element symbols in FIG. 1, FIG. 2, FIG. 7A and FIG. 7B may represent the same or similar values, or may represent values with the same or similar physical meanings.

Referring to FIG. 7A and FIG. 7B, contacts C1, C2, C3 and C4 of the measurement resistor 108 may electrically connect to different elements through a soldering material. According to the embodiment of FIG. 1, the contact C1 of the measurement resistor 108 may electrically connect to the reference circuit 102 through a first solder ball. The contact C2 of the measurement resistor 108 may electrically connect to the transistor 110 through a second solder ball. The contact C3 of the measurement resistor 108 may electrically connect to the feedback circuit 104 through a third solder ball. The contact C4 of the measurement resistor 108 may electrically connect to the feedback circuit 104 through a fourth solder ball. A resistor RS1, a resistor RS2, a resistor RS3 and a resistor RS4 in FIG. 7A and FIG. 7B may respectively represent equivalent resistors of the first solder ball, the second solder ball, the third solder ball and the fourth solder ball. When the quantity of soldering tin is greater, the TCR of each solder ball may be about 14.139 ppm/° C. When the quantity of soldering tin is smaller, the TCR of each solder ball may be about 10.805 ppm/° C. When the quantity of soldering tin is moderate, the TCR of each solder ball may be about 12.377 ppm/° C. The TCR of each solder ball may be between 15 ppm/° C. and 10 ppm/° C., or may be between 14.139 ppm/° C. and 10.805 ppm/° C.

A current I1 may enter the measurement resistor 108 from the contact C1. The current I1 may leave away from the measurement resistor 108 from the contact C4. A load current $I_{LOAD}$ may enter the measurement resistor 108 from the contact C2. The load current $I_{LOAD}$ may leave away from the measurement resistor 108 from the contact C3. According to the embodiment of the present disclosure, the current I1 may be smaller than the load current $I_{LOAD}$. In some embodiments, the current I1 may be much smaller than the load current $I_{LOAD}$.

FIG. 7B may be an equivalent circuit diagram of FIG. 7A. Referring to FIG. 7B, the measurement resistor 108 may be equivalent to a resistor with a resistance value RM. According to the Ohm's law, a voltage difference between a node A and a node B in FIG. 7A and FIG. 7B may be as shown in Equation (3):

$$V_{AB}=I1(RS1+RS4)+(I1+I_{LOAD})RM \quad (3).$$

When the current I1 may be much smaller than the load current $I_{LOAD}$, a voltage difference caused by the current I1 at the resistors RS1, RS4 and RM may be ignored. Therefore, the Equation (3) may be further modified into Equation (4):

$$V_{AB}=I_{LOAD} \times RM \quad (4).$$

In some embodiments, the measurement resistor 108 may be a coil made of a single metal or alloy. The contact C1 and the contact C2 may be formed by cutting one end of the coil. The contact C3 and the contact C4 may be formed by cutting the other end of the coil. The contact C1 and the contact C2 of the measurement resistor 108 may be made of the same material, and do not include other soldering materials. Therefore, the contact C1 and the contact C2 of the measurement resistor 108 may be homogeneous. The contact C3 and the contact C4 of the measurement resistor 108 may be made of the same material, and do not include other soldering materials. Therefore, the contact C3 and the contact C4 of the measurement resistor 108 may be homogeneous. Generally, according to data provided by a supplier, the TCR of the measurement resistor 108 in an interval of +20° C. to +60° C. is about +5 ppm/° C. to −5 ppm/° C. The TCR of the measurement resistor 108 may be smaller than the TCR of the solder ball.

Although the TCR of the measurement resistor 108 may be known from the data of the supplier, when the measurement resistor 108 is disposed in the electronic load apparatus 100 (or 200, 300, 400, 500, 600), the TCR of the measurement resistor 108 be measured again so as to determine a specification of the electronic load apparatus 100 (or 200, 300, 400, 500, 600). Referring to FIG. 2 again, when the TCR of the measurement resistor 108 is measured, the load current $I_{LOAD}$ can be measured by a current probe. When the TCR of the measurement resistor 108 is measured, a voltage difference VM between the contact C1 and the contact C4 may be measured by a voltmeter. In some embodiments, the voltage difference VM between the contact C1 and the contact C4 in FIG. 2 may also be measured by measuring a voltage difference between the node A and the node B shown in FIG. 7A or FIG. 7B.

A variation of the load current $I_{LOAD}$ may be obtained through $(I_T-I_0)/I_0$. $I_0$ indicates an initial current. $I_T$ is a current after the temperature increases T° C. Therefore, the variation of the load current $I_{LOAD}$ is a scale value without a unit, and is represented by ppm. A variation of the voltage difference VM may be obtained through $(V_T-V_0)/V_0$. $V_0$ indicates an initial voltage difference. $V_T$ is a voltage difference after the temperature increases T° C. Therefore, the variation of the voltage difference VM is a scale value without a unit, and is represented by ppm. According to the Ohm's law V=IR, if the resistance R is unchanged, the variation of the voltage V equals to the variation of the current I. Based on the above, the variation of the resistance value RM of the measurement resistor 108 can be known by subtracting the variation of the voltage difference VM from the variation of the load current $I_{LOAD}$.

According to some experiment results of the present disclosure, when the temperature increases 23° C., the variation of the load current $I_{LOAD}$ is −57 ppm, and the variation of the voltage difference VM is −17 ppm. After calculation through Equation (5), the TCR of the measurement resistor 108 being about 1.73 ppm/° C. may be obtained:

$$|(-57-(-17))/23|=1.739 \quad (5).$$

According to some experiment results of the present disclosure, when the temperature increases 26° C., the variation of the load current $I_{LOAD}$ is −97 ppm, and the variation of the voltage difference VM is −50 ppm. After the calculation through Equation (6), the TCR of the measurement resistor 108 being about 1.8 ppm/° C. may be obtained:

$$|(-97-(-50))/26|=1.807 \quad (6).$$

According to the experiment results of the present disclosure, the obtained TCR of the measurement resistor 108 disposed in the electronic load apparatus 100 (or 200, 300, 400, 500, 600) is still between a TCR range (+5 ppm/° C. to −5 ppm/° C.) provided by the supplier.

In some embodiments, the operation temperature of the electronic load apparatus 100 (or 200, 300, 400, 500, 600) may rise to 75° C. When the operation temperature of the electronic load apparatus 100 (or 200, 300, 400, 500, 600) rises to 75° C. from 25° C., the variation of the resistance value RM of the measurement resistor 108 may be 90 ppm (1.8×50=90), i.e., 0.009%. When the specification of the electronic load apparatus 100 (or 200, 300, 400, 500, 600) is made, the 90 ppm variation of the resistance RM of the measurement resistor 108 should be an acceptable measuring error.

Figure 8:
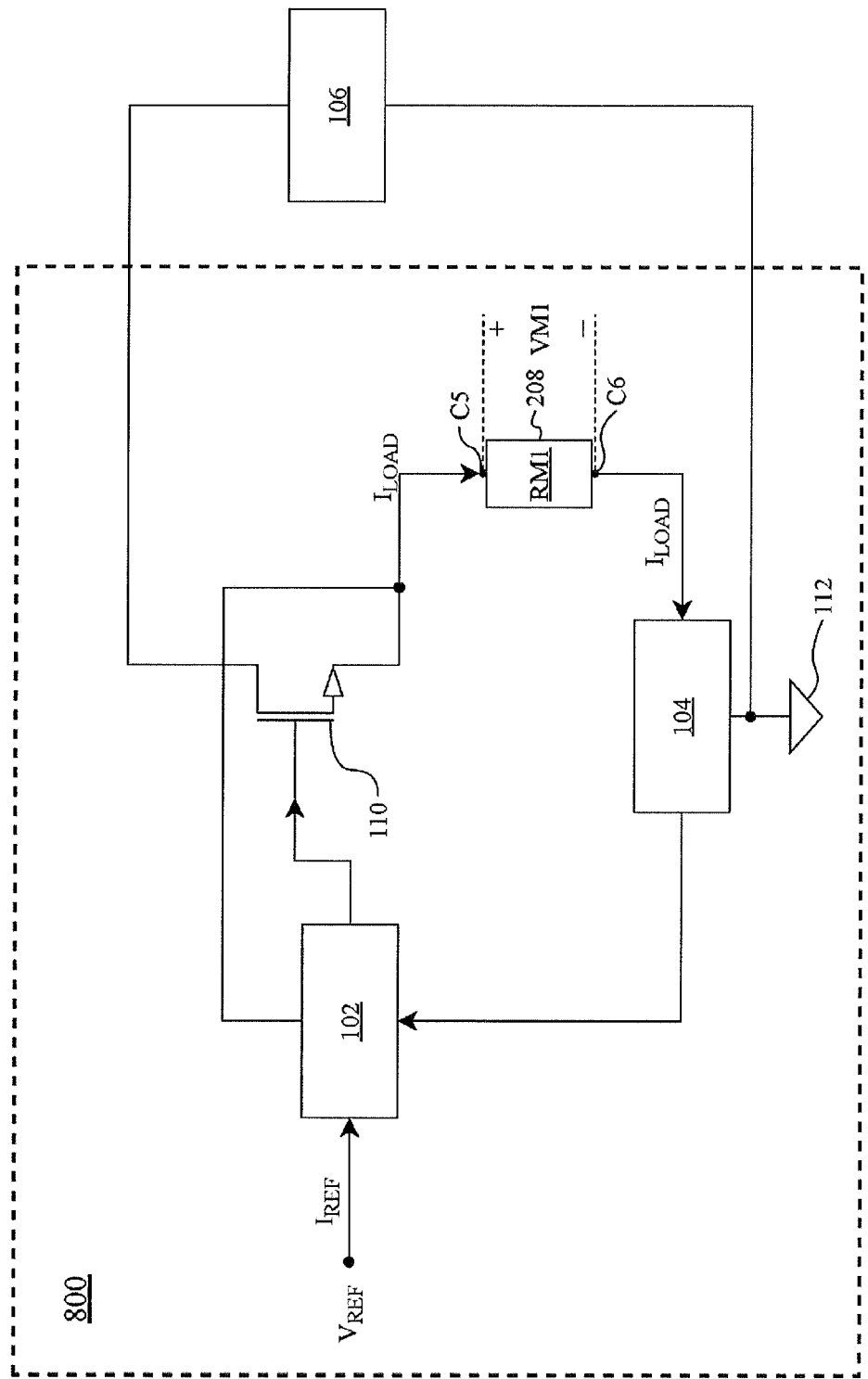
FIG. 8 is a schematic circuit diagram of an electronic load apparatus according to an embodiment of the present disclosure.

FIG. 8 is a schematic circuit diagram of an electronic load apparatus 800 according to an embodiment of the present disclosure. In some embodiments, the electronic load apparatus 100 may include a reference circuit 102, a feedback circuit 104, a transistor 110, a reference power $I_{REF}$, a measurement resistor 208 and a grounding point 112. The electronic load apparatus 100 may electrically connect to a unit under test 106. Directions of arrows shown in FIG. 8 may be used for indicating directions of the current. The electronic load apparatus 800 in FIG. 8 may electrically connect to the unit under test 106.

For more simply describing the present disclosure, elements using the same element symbols in FIG. 1 and FIG. 8 may represent the same or similar elements, or may represent elements with the same or similar functions. Additionally, values using the same element symbols in FIG.

1 and FIG. 8 may represent the same or similar values, or may represent values with the same or similar physical meanings.

The measurement resistor 208 may have a resistance value RM1. The measurement resistor 208 may be provided with a contact C5 and a contact C6. The contact C5 of the measurement resistor 208 may be located at one end of the measurement resistor 208. The contact C6 of the measurement resistor 208 may be located at the other end of the measurement resistor 208. The contact C5 of the measurement resistor 208 may electrically connect to the reference circuit 102. The contact C5 of the measurement resistor 208 may electrically connect to the transistor 110. For example, the contact C5 of the measurement resistor 208 may electrically connect to a drain or a source of the transistor 110. The contact C6 of the measurement resistor 208 may electrically connect to the feedback circuit 104.

The load current $I_{LOAD}$ may flow into the measurement resistor 208 from the contact C5. The load current $I_{LOAD}$ may flow out of the measurement resistor 208 from the contact C6. The current I1 may be smaller than the load current $I_{LOAD}$. In some embodiments, the current I1 may be much smaller than the load current $I_{LOAD}$.

The reference circuit 102 may electrically connect to the contact C5 of the measurement resistor 208. The drain or the source of the transistor 110 may electrically connect to the contact C5 of the measurement resistor 208. The drain or the source of the transistor 110 may electrically connect to an output terminal of a unit under test 106. In the embodiment of FIG. 8, the source of the transistor 110 may electrically connect to the contact C5 of the measurement resistor 208. The drain of the transistor 110 may electrically connect to an output terminal of the unit under test 106. In some embodiments, the drain of the transistor 110 may electrically connect to the contact C5 of the measurement resistor 208. The source of the transistor 110 may electrically connect to the output terminal of the unit under test 106. The output terminal of the unit under test 106 may be a terminal from which the current is output from the unit under test 106.

The electronic load apparatus 800 in FIG. 8 may electrically connect to the unit under test 106 to measure a plurality of physical features of the unit under test 106, such as electrical features. In some embodiments, the load current $I_{LOAD}$ passing through the measurement resistor 208 may be determined on the basis of a voltage difference VM1 across the measurement resistor 208 and the resistance value RM1 of the measurement resistor 208. According to the Ohm's law, the relationship among the voltage difference VM1, the resistance value RM1 and the load current $I_{LOAD}$ is as shown in Equation (7):

$$I_{LOAD} = \frac{VM1}{RM1}. \tag{7}$$

Figure 9:
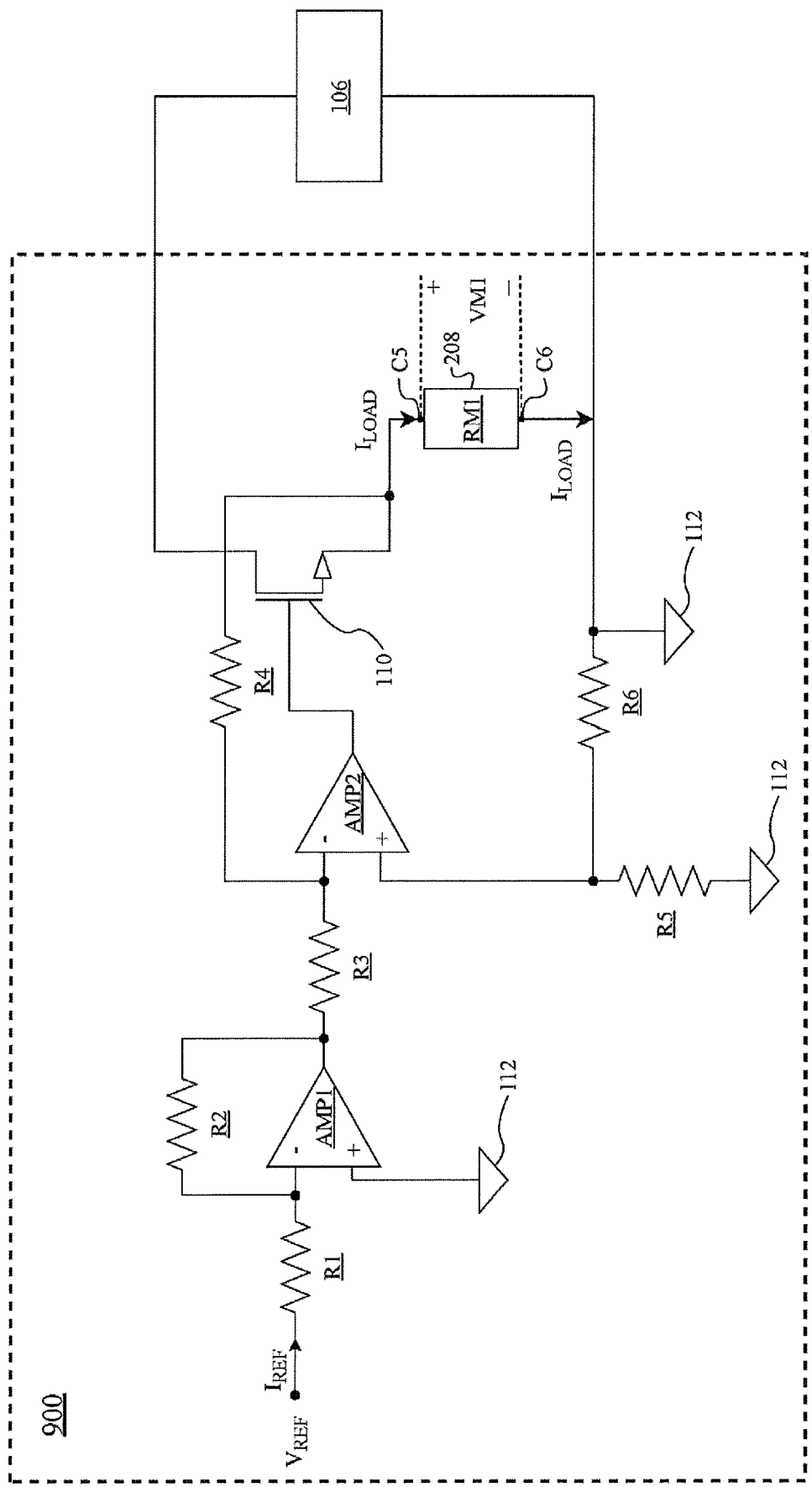
FIG. 9 is a schematic circuit diagram of an electronic load apparatus according to an embodiment of the present disclosure.

FIG. 9 is a schematic circuit diagram of an electronic load apparatus 900 according to an embodiment of the present disclosure. The electronic load apparatus 900 may be an embodiment of the electronic load apparatus 800. For more simply describing the present disclosure, elements using the same element symbols in FIG. 8 and FIG. 9 may represent the same or similar elements, or may represent elements with the same or similar functions. Additionally, values using the same element symbols in FIG. 8 and FIG. 9 may represent the same or similar values, or may represent values with the same or similar physical meanings.

Compared with FIG. 2, a measurement resistor 208 in FIG. 9 may further electrically connect to a resistor R4 (for example, through a contact C5). Compared with FIG. 2, a reference power $V_{REF}$ in FIG. 9 may electrically connect to the contact C5 of the measurement resistor 208 through two inverting closed-loop amplifiers. In some embodiments, the reference power $V_{REF}$ may electrically connect to the contact C5 of the measurement resistor 208 through the reference circuit 102. Compared with FIG. 2, a resistor R6 in FIG. 9 may electrically connect to the measurement resistor 208 (for example, through a contact C6).

Figure 10B:
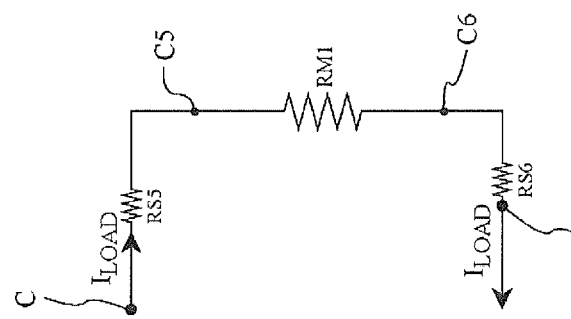
FIG. 10A and FIG. 10B are schematic circuit diagrams of a measurement resistor according to an embodiment of the present disclosure.
Figure 10A:
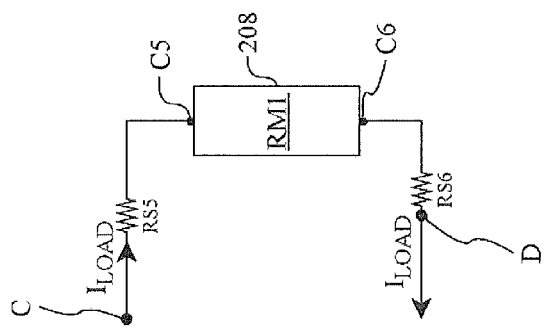

FIG. 10A and FIG. 10B are schematic circuit diagrams of a measurement resistor 208 according to an embodiment of the present disclosure. FIG. 10B may be an equivalent circuit diagram of FIG. 10A. For more simply describing the present disclosure, elements using the same element symbols in FIG. 8, FIG. 9, FIG. 10A and FIG. 10B may represent the same or similar elements, or may represent elements with the same or similar functions. Additionally, values using the same element symbols in FIG. 8, FIG. 9, FIG. 10A and FIG. 10B may represent the same or similar values, or may represent values with the same or similar physical meanings.

Referring to FIG. 10A and FIG. 10B, a contact C5 and a contact C6 of the measurement resistor 208 may electrically connect to different elements through a soldering material. According to the embodiment of FIG. 8, the contact C5 of the measurement resistor 208 may electrically connect to a reference circuit 102 through a fifth solder ball. The contact C6 of the measurement resistor 208 may electrically connect to a feedback circuit 104 through a sixth solder ball. A resistor RS5 and a resistor RS6 in FIG. 10A and FIG. 10B may respectively represent equivalent resistors of the fifth solder ball and the sixth solder ball. When the quantity of soldering tin is greater, the TCR of each solder ball may be about 14.139 ppm/° C. When the quantity of soldering tin is smaller, the TCR of each solder ball may be about 10.805 ppm/° C. When the quantity of soldering tin is moderate, the TCR of each solder ball may be about 12.377 ppm/° C. The TCR of each solder ball may be between 15 ppm/° C. and 10 ppm/° C., or may be between 14.139 ppm/° C. and 10.805 ppm/° C.

The load current $I_{LOAD}$ may enter the measurement resistor 208 from the contact C5. The load current $I_{LOAD}$ may leave away from the measurement resistor 208 from the contact C6.

FIG. 10B may be an equivalent circuit diagram of FIG. 10A. Referring to FIG. 10B, the measurement resistor 208 may be equivalent to a resistor with a resistance value RM1. According to the Ohm's law, a voltage difference between a node C and a node D in FIG. 10A and FIG. 10B may be as shown in Equation (8):

$$V_{CD} = I_{LOAD}(RS5 + RS6 + RM1) \tag{8}.$$

When the resistors RS5, RS6 and RM1 are similar, the voltage difference caused by the resistors RS5 and RS6 cannot be ignored.

Generally, according to data provided by a supplier, the TCR of the measurement resistor 208 in an interval of +20° C. to +60° C. is about +5 ppm/° C. to −5 ppm/° C. The TCR of the measurement resistor 208 may be smaller than the TCR of the solder ball. Although the TCR of the measurement resistor 208 may be known from the data of the supplier, when the measurement resistor 208 is disposed in the electronic load apparatus 800 (or 900), the TCR of the measurement resistor 208 must be measured again so as to make a specification of the electronic load apparatus 800 (or 900). Referring to FIG. 9 again, when the TCR of the measurement resistor 208 is measured, the load current $I_{LOAD}$ can be measured by a current probe. When the TCR of the measurement resistor 208 is measured, a voltage difference VM1 between the contact C5 and the contact C6 may be measured by a voltmeter. In some embodiments, the voltage difference VM1 between the contact C5 and the contact C6 in FIG. 9 may also be measured by measuring the voltage difference between the node C and the node D as shown in FIG. 10A and FIG. 10B.

According to some experiment results of the present disclosure, when the temperature increases 10° C., the variation of the load current $I_{LOAD}$ is −324 ppm, and the variation of the voltage difference VM1 is −130 ppm. After calculation through Equation (9), the TCR of the measurement resistor 208 being about 19.4 ppm/° C. may be obtained:

$$|(-324-(-130))/10|=19.4 \qquad (9).$$

According to the experiment results of the present disclosure, the obtained TCR of the measurement resistor 208 disposed in the electronic load apparatus 800 (or 900) is not between a TCR range (+5 ppm/° C. to −5 ppm/° C.) provided by the supplier. The voltage difference caused by the resistors RS5 and RS6 cannot be ignored, so that the obtained TCR of the measurement resistor 208 generates an error.

In some embodiments, the operation temperature of the electronic load apparatus 800 (or 900) may rise to 75° C. When the operation temperature of the electronic load apparatus 800 (or 900) rises to 75° C. from 25° C., the variation of the resistance value RM1 of the measurement resistor 208 may be 970 ppm (19.4×50=970), i.e., 0.097%. When the specification of the electronic load apparatus 800 (or 900) is made, the 90 ppm variation of the resistance RM of the measurement resistor 208 should be an unacceptable measuring error.

Besides the orientation shown in the figures, the apparatus or element may be oriented in other modes (rotating for 90 degrees or in other orientations). Additionally, terms relevant to connection used herein may also be interpreted accordingly. It should be understood that when a component "connects", "couples", or "links" to another component, the component may directly connect or couple to another component, or there may be an intermediate component.

As used in the present disclosure, the terms "approximately", "substantially", "essentially", and "about" are used for describing and explaining a small variation. When being used in combination with an event or circumstance, the terms may refer to an example in which the event or circumstance occurs precisely, and an example in which the event or circumstance occurs approximately. As used herein, when being used in combination with a value or range, the term "about" generally refers to a variation range within ±10%, ±5%, ±1% or ±0.5% of the value. The range may be indicated herein as from one terminal to another or between two terminals. Unless otherwise specified, all ranges disclosed herein include the terminals. The term "substantially coplanar" may refer to two surfaces within a few micrometers (μm) located along the same plane, such as two surfaces within 10 μm, within 5 μm, within 1 μm, or within 0.5 μm located along the same plane. When referring to "substantially" same value or features, the term may refer to a value within ±10%, ±5%, ±1% or ±0.5% of a mean value of the values.

The foregoing briefly describes a plurality of embodiments and detailed features of the present disclosure. The embodiments described in the present disclosure may be easily used as a basis for designing or modifying other procedures and structures for achieving the same or similar objectives and/or obtaining the same or similar advantages introduced in embodiments of the present disclosure. Such equivalent constructions do not depart from the spirit and scope of the present disclosure, and various changes, substitutions, and modifications may be made without departing from the spirit and scope of the present disclosure.

SYMBOL DESCRIPTION

100: electronic load apparatus
102: reference circuit
104: feedback circuit
106: unit under test
108: measurement resistor
110: transistor
112: grounding point
114: digital control circuit
200: electronic load apparatus
208: measurement resistor
300: electronic load apparatus
400: electronic load apparatus
500: electronic load apparatus
600: electronic load apparatus
800: electronic load apparatus
900: electronic load apparatus
A: node
ADC1: analog-to-digital converter
AMP1: operational amplifier
AMP2: operational amplifier
AMP3: operational amplifier
AMP4: operational amplifier
B: a node
C: node
C1: contact
C2: contact
C3: contact
C4: contact
C5: contact
C6: contact
D: node
I1: current
$I_{LOAD}$: load current
$I_{REF}$: reference current
$V_{REF}$: reference power
VM: voltage difference
VM1: voltage difference
R1: resistor
R2: resistor
R3: resistor
R4: resistor
R5: resistor
R6: resistor
RM: resistance value/resistor
RM1: resistance value/resistor
RS1: resistor
RS2: resistor
RS3: resistor
RS4: resistor
RS5: resistor
RS6: resistor

What is claimed is:

1. An electronic load apparatus, comprising:
   a measurement resistor, comprising a first contact, a second contact, a third contact, and a fourth contact, the first contact and the second contact corresponding to a first end of the measurement resistor, and the third contact and the fourth contact corresponding to a second end of the measurement resistor;

a reference circuit, a reference power electrically connected to the reference circuit, and the reference circuit and the first contact of the measurement resistor are electrically connected;

a transistor, comprising a drain, a gate, and a source, the reference circuit and the gate of the transistor being electrically connected, one of the source and the drain of the transistor electrically connecting to the second contact of the measurement resistor, and the other one of the drain and the source of the transistor electrically connecting to an output terminal of a unit under test; and a feedback circuit, the feedback circuit electrically connecting to the fourth contact of the measurement resistor, and the feedback circuit electrically connecting to the reference circuit.

2. The electronic load apparatus of claim 1, wherein a load current value passing through the second contact of the measurement resistor is determined based on a voltage difference across the measurement resistor and a resistance value of the measurement resistor.

3. The electronic load apparatus of claim 2, wherein a first current value passing through the first contact of the measurement resistor is smaller than the load current value.

4. The electronic load apparatus of claim 1, wherein the first contact of the measurement resistor electrically connects to the reference circuit through a first solder ball, the second contact of the measurement resistor electrically connects to the transistor through a second solder ball, the third contact of the measurement resistor electrically connects to the feedback circuit through a third solder ball, and the fourth contact of the measurement resistor electrically connects to the feedback circuit through a fourth solder ball.

5. The electronic load apparatus of claim 4, wherein the temperature coefficient of resistance of the measurement resistor is smaller than the temperature coefficient of resistance of the first solder ball, the second solder ball, the third solder ball and the fourth solder ball.

6. The electronic load apparatus of claim 1, wherein the reference circuit comprises a first inverting closed-loop amplifier and a second inverting closed-loop amplifier, the first inverting closed-loop amplifier connecting in cascade to the second inverting closed-loop amplifier, the reference power electrically connecting to an input terminal of the first inverting closed-loop amplifier, the feedback circuit electrically connecting to an input terminal of the second inverting closed-loop amplifier, and the reference power electrically connecting to the first contact of the measurement resistor through the reference circuit.

7. The electronic load apparatus of claim 1, wherein the third contact of the measurement resistor electrically connects to an input terminal of the unit under test, and the first contact of the measurement resistor electrically connects to the feedback circuit.

8. The electronic load apparatus of claim 7, wherein the feedback circuit comprises a first operational amplifier, the first contact of the measurement resistor electrically connecting to a first input terminal of the first operational amplifier, and the fourth contact of the measurement resistor electrically connecting to a second input terminal of the first operational amplifier.

9. The electronic load apparatus of claim 7, wherein the feedback circuit comprises a first analog-to-digital converter, a first input terminal and a second input terminal of the first analog-to-digital converter electrically connecting to the first contact and the fourth contact of the measurement resistor, and a first output terminal of the first analog-to-digital converter electrically connecting to the reference circuit through a digital control circuit.

10. The electronic load apparatus of claim 9, wherein a first output terminal of the digital control circuit and the reference power electrically connect to the reference circuit through an operational amplifier.

11. The electronic load apparatus of claim 1, wherein the reference circuit is configured to control a voltage applied to the gate of the transistor based on the feedback circuit.

12. The electronic load apparatus of claim 1, wherein the first contact and the second contact of the measurement resistor are homogeneous, and the third contact and the fourth contact of the measurement resistor are homogeneous.

* * * * *